(12) United States Patent
Mochizuki et al.

(10) Patent No.: US 10,234,483 B2
(45) Date of Patent: Mar. 19, 2019

(54) SAMPLING CIRCUIT, SAMPLING METHOD, SAMPLING OSCILLOSCOPE, AND WAVEFORM DISPLAY METHOD

(71) Applicant: ANRITSU CORPORATION, Kanagawa (JP)

(72) Inventors: Ken Mochizuki, Kanagawa (JP); Takashi Murakami, Kanagawa (JP); Seiya Suzuki, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 388 days.

(21) Appl. No.: 15/082,332

(22) Filed: Mar. 28, 2016

(65) Prior Publication Data

US 2016/0363614 A1 Dec. 15, 2016

(30) Foreign Application Priority Data

Jun. 11, 2015 (JP) ................. 2015-118368

(51) Int. Cl.
*G01R 13/02* (2006.01)
*H04L 7/033* (2006.01)

(52) U.S. Cl.
CPC ..... *G01R 13/0272* (2013.01); *G01R 13/0254* (2013.01); *H04L 7/0334* (2013.01)

(58) Field of Classification Search
CPC ....... H04L 7/00; H04L 7/0016; H04L 7/0054; H04L 7/02; H04L 7/027; H04L 7/0334; H04L 7/04; G01R 13/00; G01R 13/0218; G01R 13/0254; G01R 13/0272; G06F 1/10; G06F 1/12

USPC ........ 375/355, 362, 371, 373; 327/105, 107, 327/144–146, 153, 161; 370/516, 517; 713/400, 500, 503, 600

See application file for complete search history.

(56) References Cited

U.S. PATENT DOCUMENTS

| | | | |
|---|---|---|---|
| 2002/0198672 A1* | 12/2002 | Jungerman | G01R 13/345 702/106 |
| 2005/0177758 A1 | 8/2005 | Stickle | |
| 2006/0067390 A1* | 3/2006 | Tek | G01R 29/26 375/224 |
| 2007/0019768 A1* | 1/2007 | Furukawa | G01R 13/0272 375/355 |
| 2007/0291885 A1* | 12/2007 | Viss | H04L 7/0337 375/355 |
| 2008/0147340 A1* | 6/2008 | Gebara | G01R 31/3016 702/69 |

* cited by examiner

*Primary Examiner* — Young T Tse
(74) *Attorney, Agent, or Firm* — Pearne & Gordon LLP

(57) ABSTRACT

A frequency synthesizer 11a outputs a periodic signal r(t) at a frequency detuned by a predetermined frequency Δf [Hz] from a frequency of 1/integer of a frequency of a reference clock signal f0 synchronized with a signal to be measured ws. A first sampler unit 12 samples the signal to be measured ws at a timing of the trigger signal CLK. A second sampler unit 13a samples an I signal I(t) at the timing of the trigger signal CLK. A phase shifter 13b outputs a Q signal Q(t) obtained by shifting a phase of the reference clock signal f0 by 90°. A third sampler unit 13c samples the Q signal at the timing of the trigger signal CLK. A correction value calculation unit 13d calculates a correction value Δt(n) based on sampling data I(n) and Q(n) and a set value t(n) of a sampling time.

14 Claims, 2 Drawing Sheets

SAMPLING CIRCUIT, SAMPLING METHOD, SAMPLING OSCILLOSCOPE, AND WAVEFORM DISPLAY METHOD

TECHNICAL FIELD

The present invention relates to a sampling circuit, a sampling method, a sampling oscilloscope, and a waveform display method that repeatedly sample a signal to be measured from, for example, an object to be measured (DUT) such as a high-speed transceiver (high-speed semiconductor) or an optical fiber connection module (SFP+).

BACKGROUND ART

An equivalent time sampling oscilloscope (hereinafter referred to as a sampling oscilloscope) is conventionally known as, for example, a sampling oscilloscope that repeatedly samples a signal to be measured from an object to be measured (DUT) such as a high-speed transceiver or an optical fiber connection module (SFP+) and displays an observed waveform or an eye diagram. For example, a sampling oscilloscope disclosed in Patent Document 1 generates a periodic signal of which the frequency is slightly shifted from a frequency of 1/integer of a reference clock signal using a direct digital synthesizer (DDS) and performs sampling of a signal to be measured using this generated periodic signal as a time base.

RELATED ART DOCUMENT

Patent Document 1 US2005/0177758A1

DISCLOSURE OF THE INVENTION

Problem that the Invention is to Solve

Incidentally, in recent years, for example, a high-speed device of a high rate such as 32 Gbps has begun to be widely used with the increase in a bit rate. Therefore, in this type of sampling oscilloscope, high precision for coping with the high-speed device of a high rate is required, and further improvement of a jitter error is desired.

Therefore, the present invention has been made in view of the above problem, and an object thereof is to provide a low-cost sampling circuit, a sampling method, a sampling oscilloscope, and a waveform display method that achieve improvement of a jitter error and are excellent in time accuracy.

Means for Solving the Problem

To achieve the above object, a sampling circuit according to an embodiment of the present invention includes a trigger generation unit including a frequency synthesizer that outputs a periodic signal (r(t)) at a frequency detuned by a predetermined frequency (Δf [Hz]) from a frequency of 1/integer of a frequency of a reference clock signal (f0) synchronized with a signal to be measured (ws) including a repetitive signal, and a sampler driving unit that outputs a trigger signal (CLK) for sampling that is a time base from the periodic signal; a first sampler unit that samples the signal to be measured at a timing of the trigger signal; and an error detection unit including a second sampler unit that samples an I signal (I(t)) according to the reference clock signal, or the periodic signal at a timing of the trigger signal, and a correction value calculation unit that calculates a correction value (Δt(n)) of the time base based on sampling data from the second sampler unit and a set value (t(n)) of a sampling time.

In the sampling circuit according to another embodiment, the error detection unit in the sampling circuit further includes a phase shifter that outputs a Q signal (Q(t)) obtained by shifting a phase of the reference clock signal by 90°, and a third sampler unit that samples the Q signal at the timing of the trigger signal, in which a correction value calculation unit calculates a correction value (Δt(n)) of the time base based on sampling data I(n) of the I signal, sampling data Q(n) of the Q signal, and the set value t(n) of a sampling time.

In the sampling circuit according to another embodiment, the error detection unit in the sampling circuit further includes a correction value calculation unit that receives sampling data (r(n)) from the second sampler unit and a set value (t(n)) of a sampling time and calculates a correction value (Δt(n)) of the time base from a phase (Φ(n)=sin$^{-1}$(r(n))) of a prestored sinusoidal wave table.

In the sampling circuit according to another embodiment, the sampling circuit further includes: a variable delay unit that delays a periodic signal (r(t)) input from the frequency synthesizer to the sampler driving unit.

A sampling oscilloscope according to another embodiment includes the sampling circuit and a control unit that displays and controls an observed waveform or an eye diagram according to sampling data from the first sampler unit of the sampling circuit, based on the time base corrected with the correction value.

In the sampling circuit according to another embodiment, the correction value calculation unit calculates a phase Φ(n) from Equation (1) below using sampling data I(n) of the I signal I(t) and sampling data Q(n) of the Q signal Q(t), and calculates a time T(n) from Equation (2) below using the calculated phase Φ(n), $$\Phi(n)=\tan^{-1}(Q(n)/I(n)) \quad \text{Equation (1)}$$

here, $-\pi<\Phi(n)<+\pi$, and $$T(n)=\Phi(n)/2\pi f0 \quad \text{Equation (2)}$$

here, $-\frac{1}{2}f0<T(n)<\frac{1}{2}f0$; and calculates the correction value Δt(n)=T'(n)−t(n) of the time base using t(n) that is a value set as a sampling time from t(n)=Ts×n (here, n=0, 1, 2, . . . ) when a time after an unwrapping process is set to T'(n) (here, 0<T'(n)<∞), and a sampling period determined by the frequency synthesizer is set to Ts.

In the sampling circuit according to another embodiment, the correction value calculation unit receives sampling data r(n) from the second sampler unit and a set value t(n) of the sampling time from the control unit, and calculates a time T(n) from Equation (2) below using a phase Φ(n)=sin−1(r(n)) of the prestored sinusoidal wave table, $$T(n)=\Phi(n)/2\pi f0 \quad \text{Equation (2)}$$

here, $-\frac{1}{2}f0<T(n)<\frac{1}{2}f0$; and the correction value calculation unit calculates a correction value Δt(n)=T'(n)−t(n) of the time base using t(n) that is a value set as a sampling time obtained from t(n)=Ts×n (here, n=0, 1, 2, . . . ) when a time after an unwrapping process is set to T'(n) (here, 0<V(n)<∞) and a sampling period determined by the frequency synthesizer is set to Ts.

A sampling method according to another embodiment includes the steps of: outputting a periodic signal (r(t)) at a frequency detuned by a predetermined frequency (Δf [Hz]) from a frequency of 1/integer of a frequency of a reference clock signal (f0) synchronized with a signal to be measured (ws) including a repetitive signal; outputting a trigger signal (CLK) for sampling that is a time base from the periodic signal; sampling the signal to be measured at a timing of the trigger signal; and sampling an I signal (I(t)) according to the reference clock signal, or the periodic signal at a timing of the trigger signal, and calculating a correction value ($\Delta t(n)$) of the time base based on a set value (t(n)) of a sampling time.

In the sampling method according to another embodiment, the sampling method includes outputting a Q signal (Q(t)) obtained by shifting a phase of the reference clock signal by 90°; sampling the Q signal at the timing of the trigger signal; and calculating a correction value ($\Delta t(n)$) of the time base based on sampling data I(n) of the I signal, sampling data Q(n) of the Q signal, and the set value t(n) of a sampling time.

In the sampling method according to another embodiment, the sampling method further includes the step of: receiving sampling data (r(n)) of the periodic signal and a set value (t(n)) of a sampling time and calculating a correction value ($\Delta t(n)$) of the time base from a phase ($\Phi(n)=\sin^{-1}(r(n))$) of a prestored sinusoidal wave table.

In the sampling method according to another embodiment, the sampling method further includes the step of delaying the periodic signal (r(t)).

In a waveform display method according to another embodiment, the sampling method further includes the step of: displaying an observed waveform or an eye diagram according to sampling data from the signal to be measured (ws), based on the time base corrected with the correction value.

In the sampling method according to another embodiment, the step of calculating the correction value ($\Delta t(n)$) of the time base includes the steps of: calculating a phase $\Phi(n)$ from Equation (1) below using sampling data I(n) of the I signal I(t) and sampling data Q(n) of the Q signal Q(t), and calculating a time T(n) from Equation (2) below using the calculated phase $\Phi(n)$, $$\Phi(n)=\tan^{-1}(Q(n)/I(n)) \qquad \text{Equation (1)}$$

here, $-\pi<\Phi(n)<+\pi$, and $$T(n)=\Phi(n)/2\pi f0 \qquad \text{Equation (2)}$$

here, $-\frac{1}{2}f0<T(n)<\frac{1}{2}f0$; and calculating a correction value $\Delta t(n)=T'(n)-t(n)$ of the time base using t(n) that is a value set as a sampling time from $t(n)=Ts\times n$ (here, n=0, 1, 2, ... ) when a time after an unwrapping process is set to T'(n) (here, $0<T'(n)<\infty$), and a sampling period determined by the frequency synthesizer is set to Ts.

In the sampling method according to another embodiment, the step of calculating the correction value ($\Delta t(n)$) of the time base includes the steps of: receiving sampling data r(n) from the second sampler unit and a set value t(n) of the sampling time, and calculating a time T(n) from Equation (2) below using a phase $\Phi(n)=\sin{-1}(r(n))$ of the prestored sinusoidal wave table, $$T(n)=\Phi(n)/2\pi f0 \qquad \text{Equation (2)}$$

here, $-\frac{1}{2}f0<T(n)<\frac{1}{2}f0$; and calculating a correction value $\Delta t(n)=T'(n)-t(n)$ of the time base using t(n) that is a value set as a sampling time obtained from $t(n)=Ts\times n$ (here, n=0, 1, 2, ... ) when a time after an unwrapping process is set to T'(n) (here, $0<T'(n)<\infty$) and a sampling period determined by the frequency synthesizer is set to Ts.

Advantage of the Invention

According to the present invention, an error of the time base generated within the device is detected and corrected while performing the sampling of the signal to be measured based on the trigger signal that is a time base generated from the reference clock signal synchronized with the signal to be measured including a repetitive signal. Accordingly, it is possible to observe the signal to be measured from the object to be measured that is repeated at a long period, with a higher accuracy (200 fs rms) time base than a conventional time base (400 fs rms).

Further, if the reference clock signal is not used as an input of the sampler driving unit, but the output of the frequency synthesizer is used, a configuration can be simplified through a decrease in the number of samplers for correcting the error of the time base and reduction of a cost can be achieved.

BEST MODE FOR CARRYING OUT THE INVENTION

Hereinafter, embodiments of the present invention will be described in detail with reference to FIGS. 1 and 2 of the accompanying drawings.

Overview of Embodiments of the Present Invention

The present invention relates to a sampling circuit that repeatedly samples a signal to be measured from an object to be measured (DUT), a sampling method for a signal to be measured, a sampling oscilloscope including the sampling circuit, and a waveform display method for a signal to be measured.

The sampling oscilloscope including the sampling circuit of the present invention has a function of generating the trigger signal including the time base from the reference clock signal synchronized with the signal to be measured from the object to be measured, and detecting the error of the time base generated within the sampling oscilloscope (sampling circuit) to correct information on the time base while performing the sampling of the signal to be measured based on the timing of the generated trigger signal.

The sampling oscilloscope of the present invention is directed to only an equivalent time sampling scope that requires an external clock, and does not include a real-time oscilloscope that has a sampling clock therein and requires no external clock.

First Embodiment

Figure 1:
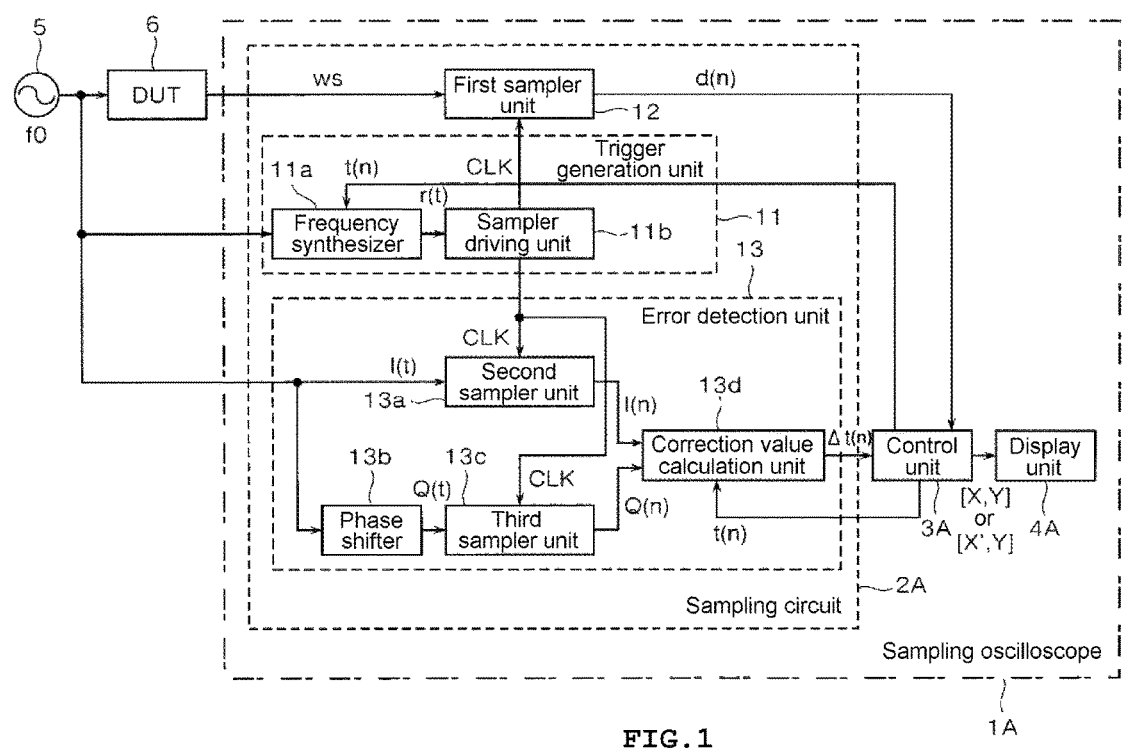
FIG. 1 is a block diagram illustrating a schematic configuration of a first embodiment of a sampling oscilloscope including a sampling circuit according to the present invention.

As illustrated in FIG. 1, a sampling oscilloscope 1A of a first embodiment is schematically configured with a sampling circuit 2A, a control unit 3A, and a display unit 4A, and samples a signal to be measured ws (for example, a repetitive signal, such as a NRZ signal or a PAM signal)

from an object to be measured (DUT) 6 at a rising (or falling) timing of a reference clock signal f0 generated by a reference clock generator 5, and displays an observed waveform (including an eye diagram in which a large number of transitions of the signal to be measured ws are sampled, superimposed, and graphically displayed) based on a result of this sampling.

The object to be measured 6 is configured with, for example, a high-speed transceiver or an optical fiber connection module (SFP+). In a case in which the high-speed transceiver is the object to be measured 6, for example, a repetitive signal (electrical signal) such as an NRZ signal or a PAM signal is input as a signal to be measured ws to the sampling oscilloscope 1A at a rising (or falling) timing of the reference clock signal f0.

Further, in a case in which the optical fiber connection module (SFP+) is the object to be measured 6, an optical signal from the object to be measured 6 subjected to optical intensity modulation is converted into a data signal (electrical signal) by an O/E converter (not illustrated) at the rising (or falling) timing of the reference clock signal f0, and this converted data signal (electrical signal) is input as the signal to be measured ws to the sampling oscilloscope 1A.

While the reference clock generator 5 and the object to be measured 6 are separate configurations in the example of FIG. 1, a configuration in which the object to be measured 6 integrally includes the reference clock generator 5 may be adopted. In this case, the object to be measured 6 includes the reference clock generator 5 that generates the reference clock signal f0, a pattern signal generation device that generates a pattern signal as the signal to be measured at a rising (or falling) timing of the reference clock signal f0, and the reference clock signal f0 on one circuit board.

The sampling circuit 2A includes a trigger generation unit 11, a first sampler unit 12, and an error detection unit 13.

The trigger generation unit 11 includes a frequency synthesizer 11a and a sampler driving unit 11b, and generates a trigger signal CLK from the reference clock signal f0 synchronized with the signal to be measured ws. This trigger signal CLK becomes a time base for sampling the signal to be measured ws input from the object to be measured 6.

The frequency synthesizer 11a includes, for example, a PLL frequency synthesizer or a direct digital synthesizer (DDS). The frequency synthesizer 11a receives a set value t(n) of a sampling time from the control unit 3A, and outputs a periodic signal r(t) at a frequency detuned by a predetermined frequency Δf [Hz] from a frequency of 1/integer of the frequency of the reference clock signal f0 from the reference clock generator 5. n indicates an order of sampling and is an integer including 0, such as n=0, 1, 2, . . . .

The frequency synthesizer 11a has a configuration in which a 1/N frequency divider (N is a positive integer equal to or greater than 1) is connected to a previous stage of the PLL frequency synthesizer or the direct digital synthesizer.

The sampler driving unit 11b receives the periodic signal r(t) from the frequency synthesizer 11a, and outputs a trigger signal (sampling pulse) CLK for sampling according to a specification (frequency band and amplitude sensitivity) of a sampler. The trigger signal CLK output from the sampler driving unit 11b is input to the first sampler unit 12, the second sampler unit 13a, and the third sampler unit 13c.

For example, a step recovery diode or a transistor circuit that operates at a high speed is used as the sampler driving unit 11b, which generates and outputs the trigger signal CLK for sampling by a high-speed pulse. The sampler driving unit 11b may have a configuration in which a frequency divider is connected to a previous stage of the step recovery diode or the transistor circuit that operates at a high speed.

Here, in a case in which the trigger signal CLK which is an output signal has a slowly rising (or falling) slope, the sampler driving unit 11b cannot turn ON/OFF the sampler at a high speed, and cannot satisfy required broadband characteristics of the sampler. Therefore, in the sampler driving unit lib, the output signal (trigger signal CLK) is required to rise (or fall) at a high speed, and the broadband characteristics are required. However, if the sampler driving unit 11b has the broadband characteristics, a problem occurs in that a noise component generated inside the sampler driving unit 11b increases. Therefore, in such a type of sampling oscilloscope of the related art, a time error (jitter) caused by the noise component in the sampler driving unit 11b is dominant, and it is difficult for an output jitter of this sampler driving unit 11b to be completely eliminated. As a result, in the sampling oscilloscope of the related art, this point causes a measurement limit of approximately 400 fs rms. Therefore, in this embodiment, the configuration of FIG. 1 is adopted as a countermeasure against this measurement limit.

The first sampler unit 12 samples the signal to be measured ws from the object to be measured 6 at the rising (or falling) timing of the trigger signal CLK for sampling input from the sampler driving unit 11b. Sampling data d(n) of the signal to be measured ws sampled by the first sampler unit 12 is input to the control unit 3A.

The error detection unit 13 includes the second sampler unit 13a, the phase shifter 13b, the third sampler unit 13c, and the correction value calculation unit 13d.

The second sampler unit 13a samples an I signal I(t) according to the reference clock signal f0 from the reference clock generator 5 at the rising (or falling) timing of the trigger signal CLK for sampling from the sampler driving unit 11b, which is the same as in the first sampler unit 12. Sampling data I(n) of the I signal I(t) sampled by the second sampler unit 13a is input to the correction value calculation unit 13d in a subsequent stage.

The phase shifter 13b shifts a phase of the reference clock signal f0 from the reference clock generator 5 by 90° and outputs the resultant reference clock signal. The reference clock signal of which the phase is shifted by 90° is input to the third sampler unit 13c as a Q signal Q(t).

The third sampler unit 13c samples the Q signal Q(t) from the phase shifter 13b at the rising (or falling) timing of the trigger signal CLK for sampling from the sampler driving unit 11b, which is the same as in the first sampler unit 12 or the second sampler unit 13a. Sampling data Q(n) of the Q signal Q(t) sampled by the third sampler unit 13c is input to the correction value calculation unit 13d in a subsequent stage.

The correction value calculation unit 13d calculates a correction value Δt(n) of a time base using the sampling data I(n) of the I signal from the second sampler unit 13a and the sampling data Q(n) of the Q signal from the third sampler unit 13c, and the set value t(n) of the sample time from the control unit 3A.

That is, the correction value calculation unit 13d calculates a phase Φ(n) from Equation (1) below using the sampling data I(n) of the I signal I(t) and the sampling data Q(n) of the Q signal Q(t). Further, the correction value calculation unit 13d calculates a time T(n) from Equation (2) below using the calculated phase Φ(n).

$$\Phi(n)=\tan^{-1}(Q(n)/I(n)) \qquad \text{Equation (1)}$$

Here, $-\pi < \Phi(n) < +\pi$ $$T(n)=\Phi(n)/2\pi f0 \qquad \text{Equation (2)}$$

Here, $-\frac{1}{2}f0<T(n)<\frac{1}{2}f0$.

The correction value calculation unit 13*d* sets the time after the unwrapping process to T'(n) (here, 0<T'(n)<∞) and calculates the correction value Δt(n)=T'(n)−t(n) of the time base.

Wherein t(n) is a value set as an ideal sampling time obtained from t(n)=Ts×n (here, n=0, 1, 2, . . . ) when the sampling period determined by the frequency synthesizer 11*a* is Ts.

The control unit 3A includes, for example, a central processing unit (CPU), or a processor for a read only memory (ROM), a random access memory (RAM), or the like, and sets the set value t(n) of the sample time in the frequency synthesizer 11*a* and the correction value calculation unit 13*d*. Further, the control unit 3A calculates a correction time t(n)+Δt(n) for correcting the set value t(n) based on the correction value Δt(n) of the time base from the correction value calculation unit 13*d*. Further, the control unit 3A captures the sampling data d(n) of the signal to be measured ws from the first sampler unit 12, and controls a display of the display unit 4A to draw an observed waveform at [X, Y]=[t(n)+Δt(n), d (n)] using the correction time t (n)+Δt(n). The control unit 3A can perform, on a value of X, a wrapping process with X0 to obtain X', draw an eye diagram at [X', Y], and control the display of the display unit 4A.

The display unit 4A includes, for example, a liquid crystal display device, and displays an observed waveform at [X, Y] or an eye diagram (eye pattern) at [X', Y] on a display screen under the control of the control unit 3A.

Operation of First Embodiment

Next, an operation of the sampling oscilloscope 1A according to the first embodiment described above will be described.

The reference clock signal f0 generated by the reference clock generator 5 is input to each of the object to be measured 6, the frequency synthesizer 11*a*, the second sampler unit 13*a*, and the phase shifter 13*b*.

If the reference clock signal f0 is input from the reference clock generator 5, the object to be measured 6 causes an amplitude level of the signal to be measured ws to transition (change) at the rising (or falling) timing of the reference clock signal f0.

If the reference clock signal f0 is input from the reference clock generator 5, the frequency synthesizer 11*a* outputs a period signal r(t) at a frequency detuned by a predetermined frequency Δf [Hz] from a frequency of 1/integer of the frequency of the reference clock signal f0, and inputs the period signal r(t) to the sampler driving unit 11*b*. If the periodic signal r(t) is input from the frequency synthesizer 11*a*, the sampler driving unit 11*b* outputs the trigger signal CLK for sampling. This trigger signal CLK is input to each of the first sampler unit 12, the second sampler unit 13*a*, and the third sampler unit 13*c*.

The first sampler unit 12 samples the signal to be measured ws from the object to be measured 6 at the rising (or falling) timing of the trigger signal CLK from the sampler driving unit 11*b*. The sampling data d(n) of the signal to be measured ws from the first sampler unit 12 is input to the control unit 3A.

The second sampler unit 13*a* samples the I signal I(t) according to the reference clock signal f0 from the reference clock generator 5 at the rising (or falling) timing of the trigger signal CLK from the sampler driving unit 11*b*. The sampling data I(n) of the I signal from the second sampler unit 13*a* is input to the correction value calculation unit 13*d*.

The phase shifter 13*b* inputs a signal obtaining by shifting the phase of the reference clock signal f0 from the reference clock generator 5 by 90° to the third sampler unit 13*c* as the Q signal Q(t). The third sampler unit 13*c* samples the Q signal Q(t) from the phase shifter 13*b* at the rising (or falling) timing of the trigger signal CLK from the sampler driving unit 11*b*. That is, the first sampler unit 12, the second sampler unit 13*a*, and the third sampler unit 13*c* perform sampling at the same timing of the trigger signal CLK from the sampler driving unit 11*b*. The sampling data Q(n) of the Q signal from the third sampler unit 13*c* is input to the correction value calculation unit 13*d*.

The correction value calculation unit 13*d* calculates the correction value Δt(n) of a time base based on the sampling data I(n) of the I signal from the second sampler unit 13*a* and the sampling data Q(n) of the Q signal from the third sampler unit 13*c*, and the set value t(n) of the sample time from the control unit 3A. This calculated correction value Δt(n) of the time base is input to the control unit 3A.

The control unit 3A calculates a correction time t(n)+Δt(n) for correcting the set value t(n) of the sample time set in the frequency synthesizer 11*a* and the correction value calculation unit 13*d* using the correction value Δt(n) of the time base from the correction value calculation unit 13*d*. The control unit 3A captures the sampling data d(n) of the signal to be measured ws from the first sampler unit 12, and displays an observed waveform at [X, Y]=[t(n)+Δt(n), d(n)] on the display screen of the display unit 4A using the correction time t(n)+Δt(n).

Second Embodiment

In the sampling oscilloscope 1A of the first embodiment described above, periods of the input reference clock signal f0 and the trigger signal CLK for sampling are shifted, and time information T(n) is acquired using quadrature signals of the I signal and the Q signal. That is, since sampling is performed including a position in which a slope (slew rate) of the sinusoidal signal is great and a position in which the slope is small with only one sinusoidal signal, it is difficult to always obtain an accurate phase Φ(n) from only an amplitude value, and two samplers including the second sampler unit 13*a* and the third sampler unit 13*c* are used to obtain a set of quadrature signals of the I signal and the Q signal.

On the other hand, in a sampling oscilloscope 1B of a second embodiment, the reference clock signal f0 is not used as an input of a second sampler unit 23*b*, but an output of a frequency synthesizer 21*a* is used. Accordingly, simplification of the configuration through a decrease in the number of samplers, and reduction of a cost are achieved. Hereinafter, a configuration of the sampling oscilloscope 1B of the second embodiment will be described with reference to FIG. 2.

Figure 2:
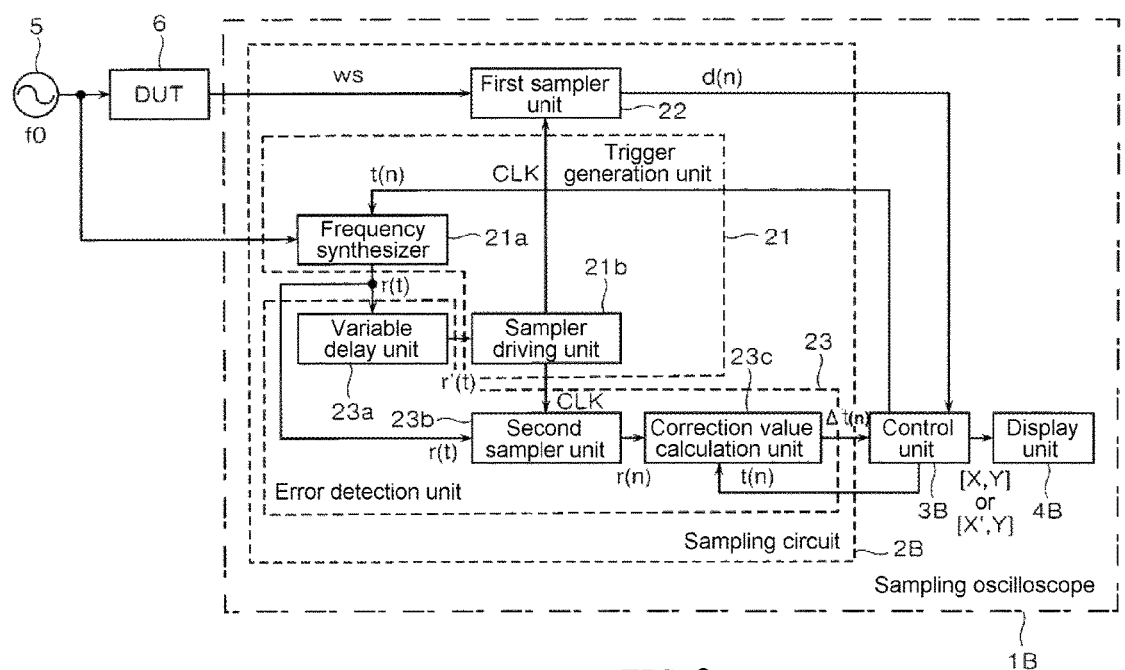
FIG. 2 is a block diagram illustrating a schematic configuration of a second embodiment of the sampling oscilloscope including the sampling circuit according to the present invention.

As illustrated in FIG. 2, the sampling oscilloscope 1B of the second embodiment is schematically configured with a sampling circuit 2B, a control unit 3B, and a display unit 4B, and samples a signal to be measured ws (for example, a repetitive signal, such as a NRZ signal or a PAM signal) from an object to be measured (DUT) 6 at a rising (or falling) timing of a reference clock signal f0 generated by a reference clock generator 5, and displays an observed waveform (including an eye diagram in which a large number of transitions of the signal to be measured ws are sampled, superimposed, and graphically displayed) based on a result of this sampling.

The object to be measured 6 is configured with, for example, a high-speed transceiver or an optical fiber connection module (SFP+). In a case in which the high-speed transceiver is the object to be measured 6, for example, a repetitive signal (electrical signal) such as an NRZ signal or a PAM signal is input as the signal to be measured ws to the sampling oscilloscope 1B at a rising (or falling) timing of the reference clock signal f0.

Further, in a case in which the optical fiber connection module (SFP+) is the object to be measured 6, an optical signal from the object to be measured 6 subjected to optical intensity modulation is converted into a data signal (electrical signal) by an O/E converter (not illustrated) at the rising (or falling) timing of the reference clock signal f0, and this converted data signal (electrical signal) is input as the signal to be measured ws to the sampling oscilloscope 1B.

While the reference clock generator 5 and the object to be measured 6 are separate configurations in the example of FIG. 2, a configuration in which the object to be measured 6 integrally includes the reference clock generator 5 may be adopted. In this case, the object to be measured 6 includes the reference clock generator 5 that generates the reference clock signal f0, a pattern signal generation device that generates a pattern signal as the signal to be measured at the rising (or falling) timing of the reference clock signal f0, and the reference clock signal f0 on one circuit board.

The sampling circuit 2B includes a trigger generation unit 21, a first sampler unit 22, and an error detection unit 23.

The trigger generation unit 21 includes a frequency synthesizer 21a and a sampler driving unit 21b, and generates a trigger signal CLK from the reference clock signal f0 synchronized with the signal to be measured ws. This trigger signal CLK becomes a time base for sampling the signal to be measured ws, which is input from the object to be measured 6.

The frequency synthesizer 21a includes, for example, a PLL frequency synthesizer or a direct digital synthesizer (DDS). The set value t(n) of the sampling time is input from the control unit 3B to the frequency synthesizer 21a, and the frequency synthesizer 21a outputs a periodic signal r(t) at a frequency detuned by a predetermined frequency $\Delta f$ [Hz] from a frequency of 1/integer of the frequency of the reference clock signal f0 from the reference clock generator 5.

The frequency synthesizer 21a may have a configuration in which a 1/N frequency divider (N is a positive integer equal to or greater than 1) is connected to a previous stage of the PLL frequency synthesizer or the direct digital synthesizer.

The sampler driving unit 21b receives a delayed periodic signal r'(t) from the variable delay unit 23a to be described below, and outputs the trigger signal (sampling pulse) CLK for sampling according to a specification (frequency band and amplitude sensitivity) of a sampler. The trigger signal CLK output from the sampler driving unit 21b is input to each of the first sampler unit 22 and the second sampler unit 23b.

For example, a step recovery diode or a transistor circuit that operates at a high speed is used as the sampler driving unit 21b, and the sampler driving unit 21b generates and outputs the trigger signal CLK for sampling using a high-speed pulse. The sampler driving unit 21b may have a configuration in which a frequency divider is connected to a previous stage of the step recovery diode or the transistor circuit that operates at a high speed.

Here, in a case in which the trigger signal CLK which is an output signal has a slowly rising slope (or falling slope), the sampler driving unit 21b cannot turn ON/OFF the sampler at a high speed and cannot satisfy required broadband characteristics of the sampler. Therefore, in the sampler driving unit 21b, it is necessary for the output signal (trigger signal CLK) to rise (or fall) at a high speed, and the broadband characteristics are required. However, if the sampler driving unit 21b has the broadband characteristics, a problem is caused in that a noise component generated inside the sampler driving unit 21b increases.

Accordingly, in this type of sampling oscilloscope of the related art, a time error (jitter) caused by a noise component in the sampler driving unit 21b is dominant, and it is difficult to completely eliminate an output jitter of this sampler driving unit 21b. As a result, in the sampling oscilloscope of the related art, the above point causes a measurement limit of approximately 400 fs rms.

Therefore, in this embodiment, the configuration in FIG. 2 is adopted as a countermeasure against this measurement limit.

The first sampler unit 22 samples the signal to be measured ws from the object to be measured 6 at a rising (or falling) timing of the trigger signal CLK for sampling which is input from the sampler driving unit 21b. Sampling data d(n) of the signal to be measured ws sampled by the first sampler unit 22 is input to the control unit 3B.

The error detection unit 23 includes the variable delay unit 23a, the second sampler unit 23b, and a correction value calculation unit 23c.

The variable delay unit 23a adjusts an amount of delay so that phases of the periodic signal r(t) of the second sampler unit 23b and the trigger signal CLK are optimized. That is, the variable delay unit 23a adjusts the amount of delay (fixed value) so that sampling is always performed near a center of the amplitude of the periodic signal r(t) which is an input signal of the second sampler unit 23b (a position in which the slope is a high slew rate which is best). Accordingly, the periodic signal r(t) of the second sampler unit 23b is sampled at substantially the same phase $\Phi(n)$ near the center of the amplitude. As a result, the phase $\Phi(n)$ can be accurately obtained from only the amplitude value.

The second sampler unit 23b samples the periodic signal r(t) from the frequency synthesizer 21a at the rising (or falling) timing of the trigger signal CLK for sampling from the sampler driving unit 21b, similar to the first sampler unit 22. Sampling data r(n) sampled by the second sampler unit 23b is input to the correction value calculation unit 23c which is a subsequent stage.

The correction value calculation unit 23c receives the sampling data r(n) from the second sampler unit 23b and the set value t(n) of the sampling time from the control unit 3B, and calculates a correction value $\Delta t(n)$ of the time base using a phase $\Phi(n)=\sin^{-1}(r(n))$ of a prestored sinusoidal wave table. Here, $-\pi/2 < \Phi(n) < +\pi/2$.

That is, the correction value calculation unit 23c calculates the time T(n) from Equation (2) below using the phase $\Phi(n)$.

$$T(n) = \Phi(n)/2\pi f0 \qquad \text{Equation (2)}$$

Here, $-\frac{1}{2}f0 < T(n) < \frac{1}{2}f0$.

The correction value calculation unit 23c sets the time after the unwrapping process to T'(n) (here, $0 < T'(n) < \infty$) and calculates the correction value $\Delta t(n) = T'(n) - t(n)$ of the time base.

Wherein t(n) is a value set as an ideal sampling time obtained from t(n)=Ts×n (here, n=0, 1, 2, . . . ) when the sampling period determined by the frequency synthesizer 11a is Ts.

The control unit 3B includes, for example, a central processing unit (CPU), or a processor for a read only memory (ROM), a random access memory (RAM), or the like, and sets the set value t(n) of the sample time in the frequency synthesizer 21a and the correction value calculation unit 23c. Further, the control unit 3B calculates a correction time t(n)+Δt(n) for correcting the set value t(n) based on the correction value Δt(n) of the time base from the correction value calculation unit 23c. Further, the control unit 3B captures the sampling data d(n) of the signal to be measured ws from the first sampler unit 22, and controls a display of the display unit 4B to draw an observed waveform at [X, Y]=[t(n)+Δt(n), d (n)] using the correction time t (n)+Δt(n). The control unit 3B can perform, on a value of X, a wrapping process with X0 to obtain X', draw an eye diagram at [X', Y], and control the display of the display unit 4B.

The display unit 4B includes, for example, a liquid crystal display device, and displays an observed waveform at [X, Y] or an eye diagram (eye pattern) at [X', Y] on a display screen under the control of the control unit 3B.

Operation of Second Embodiment

Next, an operation of the sampling oscilloscope 1B according to the second embodiment described above will be described.

The reference clock signal f0 generated by the reference clock generator 5 is input to each of the object to be measured 6 and the frequency synthesizer 21a.

If the reference clock signal f0 is input from the reference clock generator 5, the object to be measured 6 causes an amplitude level of the signal to be measured ws to transition (change) at the rising (or falling) timing of the reference clock signal f0.

If the reference clock signal f0 is input from the reference clock generator 5, the frequency synthesizer 21a outputs the period signal r(t) at a frequency detuned by a predetermined frequency Δf [Hz] from a frequency of 1/integer of the frequency of the reference clock signal f0, and inputs the period signal r(t) to the variable delay unit 23a. The variable delay unit 23a adjusts the amount of delay so that sampling is always performed near a center of the amplitude of the periodic signal r(t) of the second sampler unit 23b, and inputs a delayed period signal r'(t) of which the delay amount has been adjusted, to the sampler driving unit 21b. If the delayed periodic signal r'(t) is input from the variable delay unit 23a, the sampler driving unit 21b outputs the trigger signal CLK for sampling. This trigger signal CLK is input to each of the first sampler unit 22 and the second sampler unit 23b.

The first sampler unit 22 samples the signal to be measured ws from the object to be measured 6 at the rising (or falling) timing of the trigger signal CLK from the sampler driving unit 21b. The sampling data d(n) of the signal to be measured ws from the first sampler unit 22 is input to the control unit 3B.

The second sampler unit 23b samples the periodic signal r(t) from the frequency synthesizer 21a at the rising (or falling) timing of the trigger signal CLK from the sampler driving unit 21b, similar to the first sampler unit 22. The sampling data r(n) from the second sampler unit 23b is input to the correction value calculation unit 23c.

The correction value calculation unit 23c calculates the correction value Δt(n) of the time base based on the sampling data r(n) from the second sampler unit 23b and the set value t(n) of the sample time from the control unit 3B. This calculated correction value Δt(n) of the time base is input to the control unit 3B.

The control unit 3B calculates a correction time t(n)+Δt(n) for correcting the set value t(n) of the sample time set in the frequency synthesizer 21a and the correction value calculation unit 23c using the correction value Δt(n) of the time base from the correction value calculation unit 23c. The control unit 3B captures the sampling data d(n) of the signal to be measured ws from the first sampler unit 22, and displays an observed waveform at [X, Y]=[t(n)+Δt(n), d(n)] on the display screen of the display unit 4B using the correction time t(n)+Δt(n).

Effects of the Embodiment of the Present Invention

In each embodiment of the present invention described above, the error of the time base generated within the device is detected while sampling the signal to be measured ws based on the time base generated from the reference clock signal f0 synchronized with the signal to be measured ws including a repetitive signal, the correction time t(n)+Δt(n) is calculated, and the observed waveform (eye diagram) is displayed using the calculated correction time t(n)+Δt(n). Accordingly, the signal to be measured ws from the object to be measured 6 repeated at a long period can be observed with a high-accuracy time base of 200 fs rms, as well as the period of the reference clock signal f0. As a result, it is possible to provide a low-cost sampling circuit or sampling oscilloscope with excellent time accuracy.

Further, in the second embodiment of the present invention illustrated in FIG. 2, the reference clock signal f0 is not used as the input of the second sampler unit 23b, but the output of the frequency synthesizer 21a is used. Accordingly, the time error of the sampler driving unit 21b can be detected and corrected, and the configuration can be simplified through a decrease in the number of samplers for correcting the error of the time base and reduction of a cost can be achieved, as compared with the first embodiment of FIG. 1.

The best mode of the sampling circuit, the sampling method, the sampling oscilloscope, and the waveform display method according to the present invention has been described above, but the present invention is not limited to the description and the drawings of this mode. That is, it is understood that other modes, examples, and operation techniques made by those skilled in the art based on such a mode are included in the category of the present invention.

DESCRIPTION OF REFERENCE NUMERALS AND SIGNS 1A, 1B sampling oscilloscope
2A, 2B sampling circuit
3A, 3B control unit
4A, 4B display unit
5 reference clock generator
6 object to be measured
11 trigger generation unit
11a frequency synthesizer
11b sampler driving unit
12 first sampler unit
13 error detection unit
13a second sampler unit 13b phase shifter
13c third sampler unit
13d correction value calculation unit
21 trigger generation unit
21a frequency synthesizer
21b sampler driving unit
22 first sampler
23 error detection unit
23a variable delay unit
23b second sampler
23c correction value calculation unit

What is claimed is:

1. A sampling circuit, comprising:
a trigger generation circuit including a frequency synthesizer that outputs a periodic signal r(t) at a frequency detuned by a predetermined frequency Δf from a frequency of 1/N of a frequency of a reference clock signal f0 synchronized with a signal ws to be measured including a repetitive signal, wherein N is a positive integer, and a sampler driving circuit that outputs a trigger signal CLK for sampling that is a time base from the periodic signal r(t);
a first sampler circuit that samples the signal ws to be measured at a timing of the trigger signal CLK; and
an error detection circuit including a second sampler circuit that samples an I(t) signal according to the reference clock signal, or the periodic signal r(t) at a timing of the trigger signal CLK, and a correction value calculation circuit that calculates a correction value Δt(n) of the time base based on sampling data from the second sampler circuit and a set value t(n) of a sampling time.

2. The sampling circuit according to claim 1, wherein the error detection circuit further includes:
a phase shifter that outputs a Q(t) signal obtained by shifting a phase of the reference clock signal by 90°, and
a third sampler circuit that samples the Q(t) signal at the timing of the trigger signal CLK,
wherein the correction value calculation circuit calculates the correction value Δt(n) of the time base based on sampling data I(n) of the I(t) signal, sampling data Q(n) of the Q(t) signal, and the set value t(n) of the sampling time.

3. The sampling circuit according to claim 2,
wherein the correction value calculation circuit further calculates a phase Φ(n) from Equation (1) below using the sampling data I(n) of the I(t) signal and the sampling data Q(n) of the Q(t) signal, and calculates a time T(n) from Equation (2) below using the calculated phase Φ(n), $$\Phi(n)=\tan^{-1}(Q(n)/I(n)) \quad \text{Equation (1)}$$

where, $-\pi<\Phi(n)<+\pi$, and $$T(n)=\Phi(n)/2\pi f0 \quad \text{Equation (2)}$$

where, $-\frac{1}{2}f0<T(n)<\frac{1}{2}f0$; and
calculates the correction value Δt(n)=T'(n)−t(n) of the time base using t(n) that is a value set as a sampling time from t(n)=Ts×n, wherein n=0, 1, 2, ... when a time after an unwrapping process is set to T'(n), wherein 0<T'(n)<∞, and a sampling period determined by the frequency synthesizer is set to Ts.

4. The sampling circuit according to claim 1, wherein the correction value calculation circuit receives sampling data r(n) from the second sampler circuit and the set value t(n) of the sampling time and calculates the correction value Δt(n) of the time base from a phase $\Phi(n)=\sin^{-1}(n)$ stored in a prestored sinusoidal wave table.

5. The sampling circuit according to claim 4, wherein the error detection circuit further includes:
a variable delay circuit that delays the periodic signal r(t) from the frequency synthesizer to the sampler driving circuit.

6. A sampling oscilloscope, comprising:
the sampling circuit according to claim 1; and
a control circuit that controls a display to draw an observed waveform or an eye diagram according to sampling data d(n) from the first sampler circuit of the sampling circuit, based on the time base corrected with the correction value Δt(n).

7. The sampling circuit according to claim 6,
wherein the correction value calculation circuit receives sampling data r(n) from the second sampler circuit and the set value t(n) of the sampling time from the control circuit, and calculates a time T(n) from Equation below using a phase $\Phi(n)=\sin^{-1}(r(n))$ of a prestored sinusoidal wave table, $$T(n)=\Phi(n)/2\pi f0 \quad \text{Equation}$$

where, $-\frac{1}{2}f0<T(n)<\frac{1}{2}f0$; and
the correction value calculation circuit calculates the correction value Δt(n)=T'(n)−t(n) of the time base using t(n) that is a value set as a sampling time obtained from t(n)=Ts×n, wherein n=0, 1, 2, ... when a time after an unwrapping process is set to T'(n), wherein 0<T'(n)<∞ and a sampling period determined by the frequency synthesizer is set to Ts.

8. A sampling method, comprising the steps of:
outputting a periodic signal r(t) at a frequency detuned by a predetermined frequency Δf from a frequency of 1/N of a frequency of a reference clock signal f0 synchronized with a signal ws to be measured including a repetitive signal, wherein N is a positive integer;
outputting a trigger signal CLK for sampling that is a time base from the periodic signal r(t);
sampling the signal ws to be measured at a timing of the trigger signal CLK;
sampling an I(t) signal according to the reference clock signal, or the periodic signal r(t) at a timing of the trigger signal CLK; and
calculating a correction value Δt(n) of the time base based on the sampled I(t) signal or the sampled periodic signal r(t) and a set value t(n) of a sampling time.

9. The sampling method according to claim 8, further comprising the steps of:
outputting a Q(t) signal obtained by shifting a phase of the reference clock signal by 90°;
sampling the Q(t) signal at the timing of the trigger signal CLK; and
calculating the correction value Δt(n) of the time base based on sampling data I(n) of the I(t) signal, sampling data Q(n) of the Q(t) signal, and the set value t(n) of the sampling time.

10. The sampling method according to claim 9,
wherein the step of calculating the correction value Δt(n) of the time base includes the steps of:
calculating a phase Φ(n) from Equation (1) below using the sampling data I(n) of the I(t) signal and the sampling data Q(n) of the Q(t) signal, and calculating a time T(n) from Equation (2) below using the calculated phase Φ(n), $$\Phi(n)=\tan^{-1}(Q(n)/I(n)) \quad \text{Equation (1)}$$

where, $-\pi < \Phi(n) < +\pi$, and $$T(n) = \Phi(n)/2\pi f0 \qquad \text{Equation (2)}$$

where, $-\frac{1}{2}f0 < T(n) < \frac{1}{2}f0$; and calculating the correction value $\Delta t(n) = T'(n) - t(n)$ of the time base using $t(n)$ that is a value set as a sampling time from $t(n) = Ts \times n$, wherein $n = 0, 1, 2, \ldots$ when a time after an unwrapping process is set to $T'(n)$, wherein $0 < T'(n) < \infty$, and a sampling period determined by the frequency synthesizer is set to Ts.

11. The sampling method according to claim 8, further comprising the step of:

receiving sampling data $r(n)$ of the periodic signal $r(t)$ and the set value $t(n)$ of the sampling time and calculating the correction value $\Delta t(n)$ of the time base from a phase $\Phi(n) = \sin^{-1}(r(n))$ stored in a prestored sinusoidal wave table.

12. The sampling method according to claim 11, further comprising the step of:

delaying the periodic signal $r(t)$ prior to the step of sampling the $I(t)$ signal or the periodic signal $r(t)$.

13. An oscilloscope sampling method comprising the sampling method according to claim 8, wherein the oscilloscope sampling method further comprises the step of:

controlling a display to draw an observed waveform or an eye diagram according to sampling data $d(n)$ from the signal ws to be measured based on the time base corrected with the correction value $\Delta t(n)$.

14. The sampling method according to claim 11, wherein the step of calculating the correction value $\Delta t(n)$ of the time base includes the steps of:

receiving the sampling data $r(n)$ from a sampler circuit and the set value $t(n)$ of the sampling time, and calculating a time $T(n)$ from Equation below using a phase $\Phi(n) = \sin^{-1}(r(n))$ of the prestored sinusoidal wave table, $$T(n) = \Phi(n)/2\pi f0 \qquad \text{Equation}$$

where, $-\frac{1}{2}f0 < T(n) < \frac{1}{2}f0$; and calculating the correction value $\Delta t(n) = T'(n) - t(n)$ of the time base using $t(n)$ that is a value set as a sampling time obtained from $t(n) = Ts \times n$, wherein $n = 0, 1, 2, \ldots$ when a time after an unwrapping process is set to $T'(n)$, wherein $0 < T'(n) < \infty$ and a sampling period is set to Ts.

* * * * *